(12) United States Patent
Loubet et al.

(10) Patent No.: US 10,714,392 B2
(45) Date of Patent: Jul. 14, 2020

(54) OPTIMIZING JUNCTIONS OF GATE ALL AROUND STRUCTURES WITH CHANNEL PULL BACK

(71) Applicants: International Business Machines Corporation, Armonk, NY (US); COMMISSARIAT A L'ENERGIE ATOMIQUE ET AUX ENERGIES ALTERNATIVES, Grenoble (FR)

(72) Inventors: Nicolas Loubet, Guilderland, NY (US); Emmanuel Augendre, Le Sappey en Chartreuse (FR); Remi Coquand, Le Touvet (FR); Shay Reboh, La Buisse (FR)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/038,985

(22) Filed: Jul. 18, 2018

(65) Prior Publication Data
US 2020/0027791 A1 Jan. 23, 2020

(51) Int. Cl.
*H01L 21/8234* (2006.01)
*H01L 21/8238* (2006.01)
*H01L 29/66* (2006.01)
*H01L 29/06* (2006.01)
*H01L 29/78* (2006.01)
(Continued)

(52) U.S. Cl.
CPC ........... *H01L 21/823431* (2013.01); *H01L 21/823412* (2013.01); *H01L 21/823842* (2013.01);
(Continued)

(58) Field of Classification Search
CPC .......... H01L 29/0673; H01L 29/42392; H01L 29/78696; H01L 29/66545;
(Continued)

(56) References Cited

U.S. PATENT DOCUMENTS 7,829,916 B2    11/2010    Morand et al.
8,384,065 B2    2/2013    Bangsaruntip et al.
(Continued)

OTHER PUBLICATIONS

Loup et al., "Silicon and SiGe alloys wet etching using TMAH chemistry," Abstract #2101, 224th ECS Meeting, Oct./Nov. 2013, 1 page.
(Continued)

*Primary Examiner* — Jonathan Han
(74) *Attorney, Agent, or Firm* — Vazken Alexanian; Michael J. Chang, LLC

(57) ABSTRACT

Techniques for optimizing junctions of a gate-all-around nanosheet device are provided. In one aspect, a method of forming a nanosheet device includes: forming an alternating series of first/second nanosheets including a first/second material as a stack on a wafer; forming a dummy gate(s) on the stack; patterning the stack into a fin stack(s) beneath the dummy gate(s); etching the fin stack(s) to selectively pull back the second nanosheets in the fin stack(s) forming pockets in the fin stack(s); filling the pockets with a strain-inducing material; burying the dummy gate(s) in a dielectric material; selectively removing the dummy gate(s) forming a gate trench(es) in the dielectric material; selectively removing either the first nanosheets or the second nanosheets from the fin stack(s); and forming a replacement gate(s) in the gate trench(es). A nanosheet device is also provided.

15 Claims, 12 Drawing Sheets

(51) Int. Cl.
*H01L 29/423* (2006.01)
*H01L 27/088* (2006.01)
*H01L 21/3065* (2006.01)
*H01L 21/306* (2006.01)

(52) U.S. Cl.
CPC ...... *H01L 27/0886* (2013.01); *H01L 29/0673* (2013.01); *H01L 29/42392* (2013.01); *H01L 29/6653* (2013.01); *H01L 29/6681* (2013.01); *H01L 29/66553* (2013.01); *H01L 29/7848* (2013.01); *H01L 29/7853* (2013.01); *H01L 21/3065* (2013.01); *H01L 21/30604* (2013.01)

(58) Field of Classification Search
CPC ....... H01L 21/02532; H01L 21/823821; H01L 29/6681; H01L 21/0245; H01L 21/02507; H01L 21/02603
USPC .............................................. 257/24; 438/151
See application file for complete search history.

(56) References Cited

U.S. PATENT DOCUMENTS

| | | |
|---|---|---|
| 8,466,451 B2 | 6/2013 | Chang et al. |
| 9,257,527 B2 | 2/2016 | Hashemi et al. |
| 9,362,355 B1 | 6/2016 | Cheng et al. |
| 9,425,318 B1 | 8/2016 | Hoentschel et al. |
| 2014/0151639 A1* | 6/2014 | Chang ............... H01L 29/42392 257/27 |
| 2014/0197377 A1* | 7/2014 | Kim ..................... H01L 27/092 257/29 |
| 2016/0020305 A1 | 1/2016 | Obradovic et al. |
| 2016/0111495 A1 | 4/2016 | Brand et al. |
| 2016/0111513 A1* | 4/2016 | Liu ................... H01L 29/42364 438/163 |
| 2016/0118304 A1 | 4/2016 | Zang et al. |
| 2016/0204228 A1* | 7/2016 | Tapily .............. H01L 29/66742 438/151 |
| 2017/0141207 A1* | 5/2017 | Cheng ............... H01L 29/66742 |

OTHER PUBLICATIONS

K.D. Mackenzie et al., "Stress Control of Si-Based PECVD Dielectrics," Proc. Symp. Silicon Nitride and Silicon Dioxide Thin Insulating Films & Other Emerging Dielectrics VIII, PV2005-01, 148-159 (May 2005) (13 total pages).

* cited by examiner

OPTIMIZING JUNCTIONS OF GATE ALL AROUND STRUCTURES WITH CHANNEL PULL BACK

FIELD OF THE INVENTION

The present invention relates to gate-all-around (GAA) nanosheet devices, and more particularly, to techniques for optimizing junctions of a GAA nanosheet device using channel pull back.

BACKGROUND OF THE INVENTION

Nanosheet devices include a vertical stack of channel layers interconnecting a source and a drain. Advantageously, the channel layers are suspended between the source and the drain, thus enabling a gate-all-around (or GAA) design.

A compressively-strained channel for p-channel field-effect transistors (p-FETs) serves to increase the hole mobility and thus enhance device performance. With current nanosheet device designs however, the source and the drains formed at the ends of the channels often have a high defect density, and thus have a limited effect on inducing compressive strain in the channels.

Therefore, nanosheet device fabrication techniques that effectively induce compressive strain in the channel layers, and hence improve overall device performance, would be desirable.

SUMMARY OF THE INVENTION

The present invention provides techniques for optimizing junctions of a gate-all-around (GAA) nanosheet device using channel pull back. In one aspect of the invention, a method of forming a nanosheet device is provided. The method includes: forming an alternating series of first nanosheets including a first material and second nanosheets including a second material as a stack on a wafer; forming at least one dummy gate on the stack; forming spacers along opposite sidewalls of the at least one dummy gate; patterning the stack into at least one fin stack beneath the at least one dummy gate; etching the at least one fin stack to selectively pull back the second nanosheets in the at least one fin stack forming pockets in the at least one fin stack; filling the pockets with a strain-inducing material; forming source and drains on opposite sides of the at least one fin stack; burying the at least one dummy gate in a dielectric material; selectively removing the at least one dummy gate forming at least one gate trench in the dielectric material; selectively removing, through the at least one gate trench, either the first nanosheets or the second nanosheets from the at least one fin stack; and forming at least one replacement gate in the at least one gate trench.

In another aspect of the invention, a nanosheet device is provided. The nanosheet device includes: at least one fin stack disposed on a wafer, the at least one fin stack having nanosheets including either a first material or a second material; a strain-inducing material present in pockets in the at least one fin stack; source and drains on opposite sides of the at least one fin stack; and at least one gate surrounding the nanosheets in a gate-all-around configuration.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for effectively inducing compressive strain on the nanosheet channels of a fin stack using channel pull back, wherein the nanosheet channels are etched back, forming pockets in the fin stack. A defect-free epitaxial material or tensile or compressive dielectric is then grown or deposited in the pockets straining the nanosheet channels. The nanosheet channels are then released from the stack, and a gate is formed surrounding a portion of each of the nanosheet channels in a gate-all-around (GAA) configuration.

As will be described in detail below, the starting structure for the present nanosheet devices is a stack of active channel layers alternating with sacrificial layers. By 'sacrificial' it is meant that the layer, or portion thereof, is removed during fabrication of the device. For instance, removal of the sacrificial layers from between channel layers serves to release the channel layers from the stack, thereby enabling the GAA configuration. According to an exemplary embodiment, silicon (Si) and silicon germanium (SiGe) are employed as the active channel layer and sacrificial layer materials, or vice versa. Namely, in that case, when the active channel layers in the stack are formed from Si, the sacrificial layers in the stack are formed from SiGe. When it comes time to release the channel layers from the stack, SiGe can be etched selectively to Si. Conversely, when the active channel layers in the stack are formed from SiGe, the sacrificial layers in the stack are formed from Si. Likewise, Si can be etched selective to SiGe in order to release the channel layers from the stack.

Further, the present process employs a replacement gate flow. With a replacement gate process flow, a sacrificial or 'dummy' gate is placed early on in the process over the channel region of the device. The dummy gate serves as a placeholder for the final gate of the device that will replace the dummy gate later on in the process. Hence, the final gate of the device may also be referred to herein as a 'replacement' gate. Advantageously, the use of a dummy gate permits the formation of device structures, such as the source and drains without exposing the replacement gate to potentially harmful conditions such as elevated annealing temperatures (since the replacement gate is placed at the end of the process). High-κ metal gates are particularly susceptible to processing damage.

The term 'nanosheet,' as used herein, refers to a sheet or a layer having nanoscale dimensions. Further, the term 'nanosheet' is meant to encompass other nanoscale structures such as nanowires. For instance, 'nanosheet' can refer to a nanowire with a larger width, and/or 'nanowire' can refer to a nanosheet with a smaller width, and vice versa.

Figure 1:
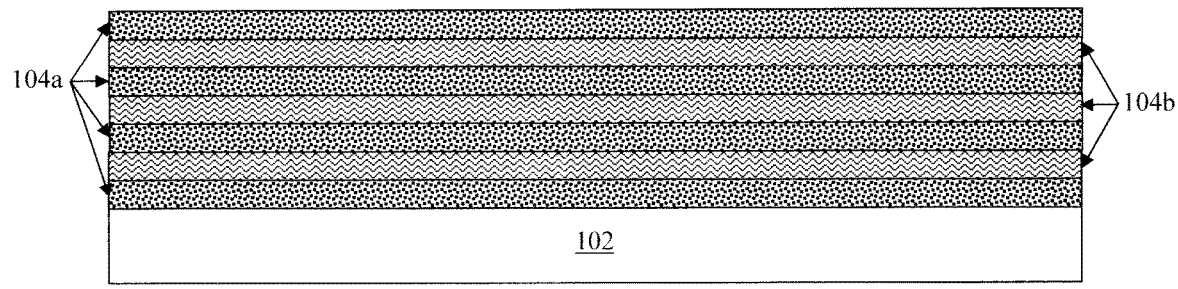
FIG. 1 is a cross-sectional diagram illustrating an alternating series of (first/second) nanosheets having been formed in a stack on a wafer according to an embodiment of the present invention.

An exemplary methodology for forming the present nanosheet device is now described by way of reference to FIGS. 1-23. As shown in FIG. 1, the process begins by forming a series of nanosheets as a stack on a wafer 102, the nanosheets in the stack alternating between nanosheets 104a of a first material and nanosheets 104b of a second material. As highlighted above, either the nanosheets 104a or 104b will serve as the active channel nanosheets of a given device (e.g., a device I or a device II—see below) while the others serve as sacrificial nanosheets. Thus, for instance, if the nanosheets 104a are the active channel nanosheets, then the nanosheets 104b are the sacrificial nanosheets. Conversely, if the nanosheets 104b are the active channel nanosheets, then the nanosheets 104a are the sacrificial nanosheets. Further, it is not a requirement that the same nanosheets 104a or 104b be selected as the active channel/sacrificial nanosheets throughout all devices. To the contrary in fact, in the instant example the role of the nanosheets 104a and 104b as active channel and sacrificial nanosheets is opposite in the devices (i.e., device I and device II) being formed.

A qualification of the (active channel/sacrificial) materials used for the nanosheets 104a and 104b is that they provide etch selectivity to one another. That way, the sacrificial material can later be removed, thereby releasing the active channel nanosheets from the stack. By way of example only, materials that provide such etch selectivity include, but are not limited to, Si and SiGe. By way of example only, etchants such as wet hot SC1, vapor phase hydrogen chloride (HCl), vapor phase chlorine trifluoride ($ClF_3$) and other reactive clean processes (RCP) are selective for etching of SiGe versus Si. Ammonium hydroxide ($NH_4OH$), tetraethylammonium hydroxide (TEAH) and/or tetraethylammonium hydroxide (TMAH) can be used to etch Si versus SiGe (as well as for selective etching of low versus high Ge content—see below). Thus, according to one exemplary embodiment, the nanosheets 104a and 104b are either Si or SiGe nanosheets, with the nanosheets 104a being SiGe nanosheets when the nanosheets 104b are Si nanosheets, and vice versa. Arbitrarily, in the examples that follow the nanosheets 104a are SiGe nanosheets and the nanosheets 104b Si nanosheets. However, this is merely a non-limiting example that is provided to illustrate the present techniques, and other active channel/sacrificial nanosheet configurations are contemplated herein such as where the nanosheets 104a are Si nanosheets and the nanosheets 104b are SiGe nanosheets.

According to an exemplary embodiment, the nanosheets 104a and 104b are epitaxially grown on the wafer 102. For instance, by way of example only, an epitaxial nanosheet of SiGe can be grown on the wafer 102 (as a nanosheet 104a) followed by growth of an epitaxial nanosheet of Si (as a nanosheet 104b) on the epitaxial SiGe nanosheet, and so on. The number of nanosheets 104a/104b formed in the stack can be varied, e.g., to increase/decrease the number of current carrying channels in the devices. Further, if so desired, the germanium (Ge) content in the nanosheets (and other device structures) can be controlled. For instance, as will be described in detail below, in one exemplary embodiment, a lower-Ge content is employed in the SiGe nanosheets as compared to a (higher-Ge content) strain-inducing epitaxial SiGe grown in the pockets. That way, during channel release, the lower-Ge content SiGe nanosheets can be removed selective to the higher-Ge content strain-inducing SiGe in the pockets and Si nanosheet channels. By way of example only, use of $NH_4OH$, TEAH and/or TMAH as an etchant provides etch selectivity for SiGe based on Ge content, with an increase in Ge content corresponding to a decrease in the etch rate. See, for example, Loup et al., "Silicon and SiGe alloys wet etching using TMAH chemistry," Abstract #2101, $224^{th}$ ECS Meeting, October/November 2013, 1 page (hereinafter "Loup"), the contents of which are incorporated by reference as if fully set forth herein. As provided in Loup, "[i]ncreasing the Ge content in . . . Si1-xGex alloys lead to strong decrease of the etch rate . . . whereas full Ge layers do not etch at all." According to an exemplary embodiment, the SiGe nanosheets have a (lower) Ge content of from about 30% Ge to about 60% Ge, and ranges therebetween, whereas the strain-inducing SiGe grown in the pockets has a (higher) Ge content of from about 60% Ge to about 100% Ge (i.e., pure Ge), and ranges therebetween.

Suitable configurations for wafer 102 include, but are not limited to, a bulk semiconductor wafer (e.g., a bulk Si wafer, a bulk germanium (Ge) wafer, a bulk SiGe wafer, a bulk III-V wafer, etc.) and a semiconductor-on-insulator (SOI) wafer. SOI wafers include a SOI layer separated from an underlying substrate by a buried insulator. When the buried insulator is an oxide, it is also referred to as a buried oxide or BOX. Suitable materials for the SOI layer include, but are not limited to, Si, Ge, SiGe, III-V, etc. Wafer 102 shown in FIG. 1 generically represents any of these wafer configurations.

At least one dummy gate 204 is then formed on the stack. See FIG. 2. In the instant example, multiple (i.e., a first I, second II, etc.) dummy gates 204 are formed on the stack. As will be described in detail below, these first I and second II dummy gates 204 will correspond to the formation of one nanosheet device with the first material (e.g., Si) as the channel material, and another nanosheet device with the second material (e.g., SiGe) as the channel material, respectively.

Figure 2:
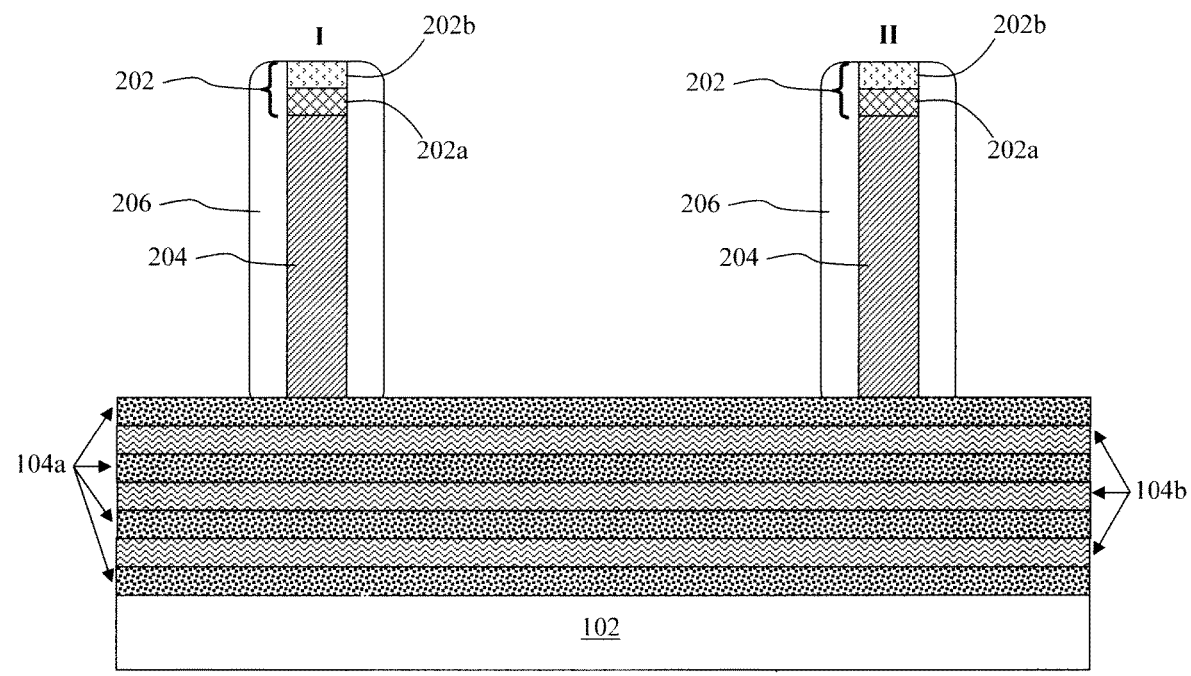
FIG. 2 is a cross-sectional diagram illustrating at least one (first/second) dummy gates having been formed on the stack, and spacers having been formed alongside opposite sidewalls of the dummy gates according to an embodiment of the present invention.

According to an exemplary embodiment, the dummy gates 204 are formed by blanket depositing a suitable dummy gate material onto the stack, forming dummy gate hardmasks 202 on the dummy gate material marking the footprint and location of the dummy gates 204, and then using the dummy gate hardmasks 202 to pattern the individual dummy gates 204 shown in FIG. 2. Suitable dummy gate materials include, but are not limited to, poly-silicon (poly-Si) and/or amorphous Si. In the instant example, a dual layer dummy gate hardmask is employed including a nitride hardmask layer 202a and an oxide hardmask layer 202b disposed on top of the nitride hardmask layer 202a. Suitable materials for the nitride hardmask layer include, but are not limited to, silicon nitride (SiN), silicon boron carbon nitride (SiBCN), silicon oxycarbon nitride (SiOCN), and/or silicon carbon nitride (SiCN). Suitable materials for the oxide hardmask layer 202b include, but are not limited to, silicon dioxide ($SiO_2$) and/or silicon carbon oxide (SiCO).

Following patterning of the dummy gates 204, spacers 206 are then formed along opposite sidewalls of the dummy gates. The spacers 206 serve to offset the (dummy/replacement) gates from the source and drain regions—to be formed as described below. According to an exemplary embodiment, spacers 206 are formed by first depositing a suitable spacer material onto the dummy gates 204, and then using standard lithography and etching techniques to pattern the spacer material into the individual spacers 206 shown in FIG. 2. A directional etching process such as reactive ion etching (RIE) may be employed for the spacer etch. Suitable spacer materials include, but are not limited to, SiBCN, SiOCN and/or SiCO.

Figure 3:
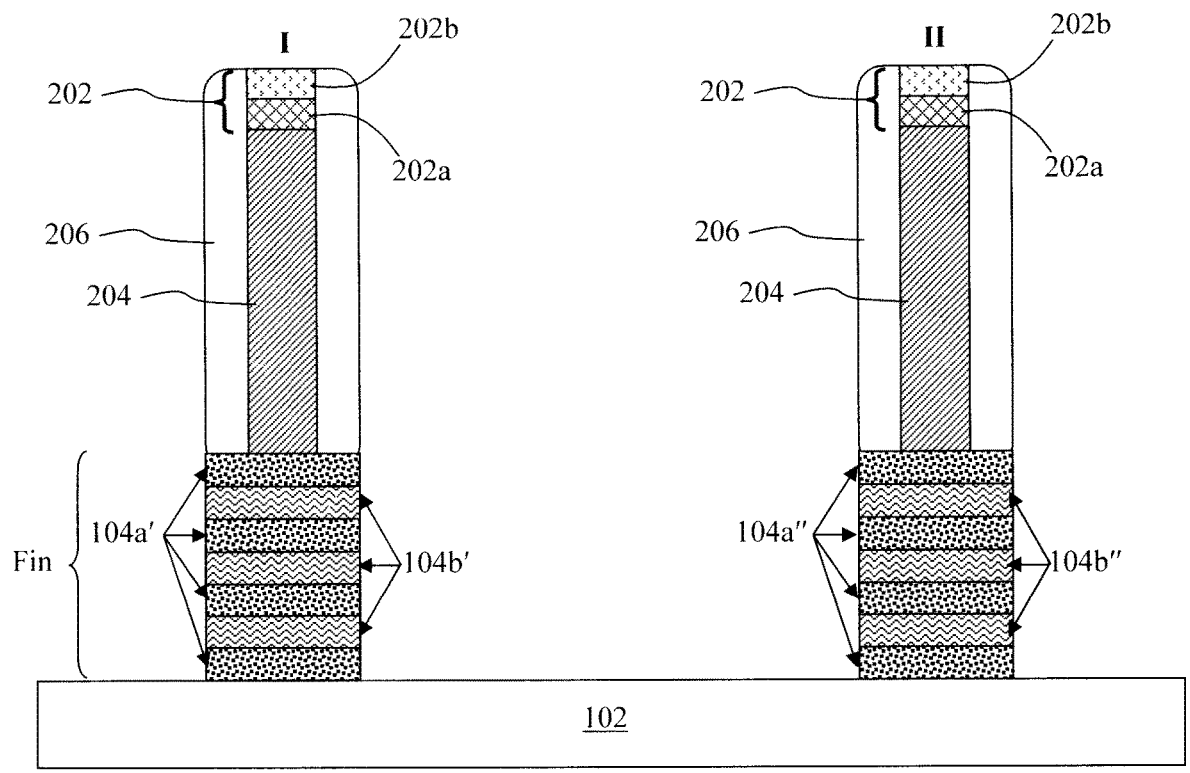
FIG. 3 is a cross-sectional diagram illustrating the stack having been patterned into at least one (first/second) fin stack beneath the dummy gates according to an embodiment of the present invention.
Figure 4:
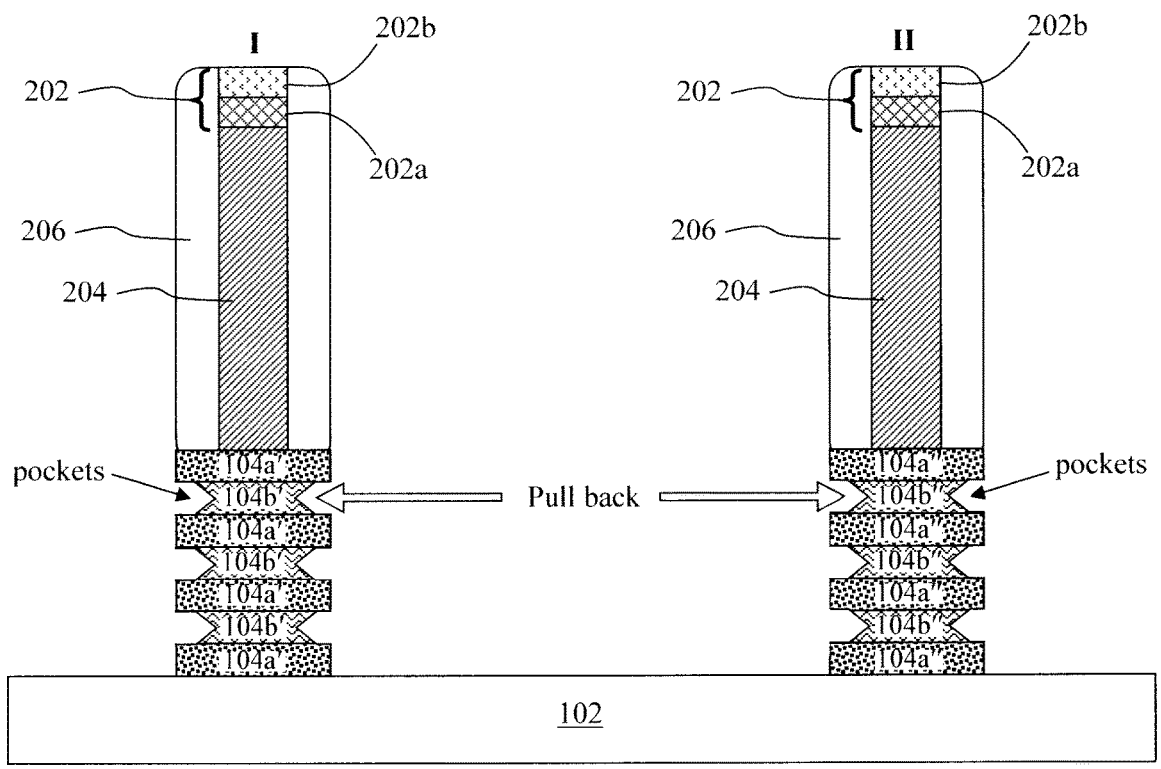
FIG. 4 is a cross-sectional diagram illustrating a selective pull back of one of the nanosheets to form pockets in the fin stacks according to an embodiment of the present invention.
Figure 5:
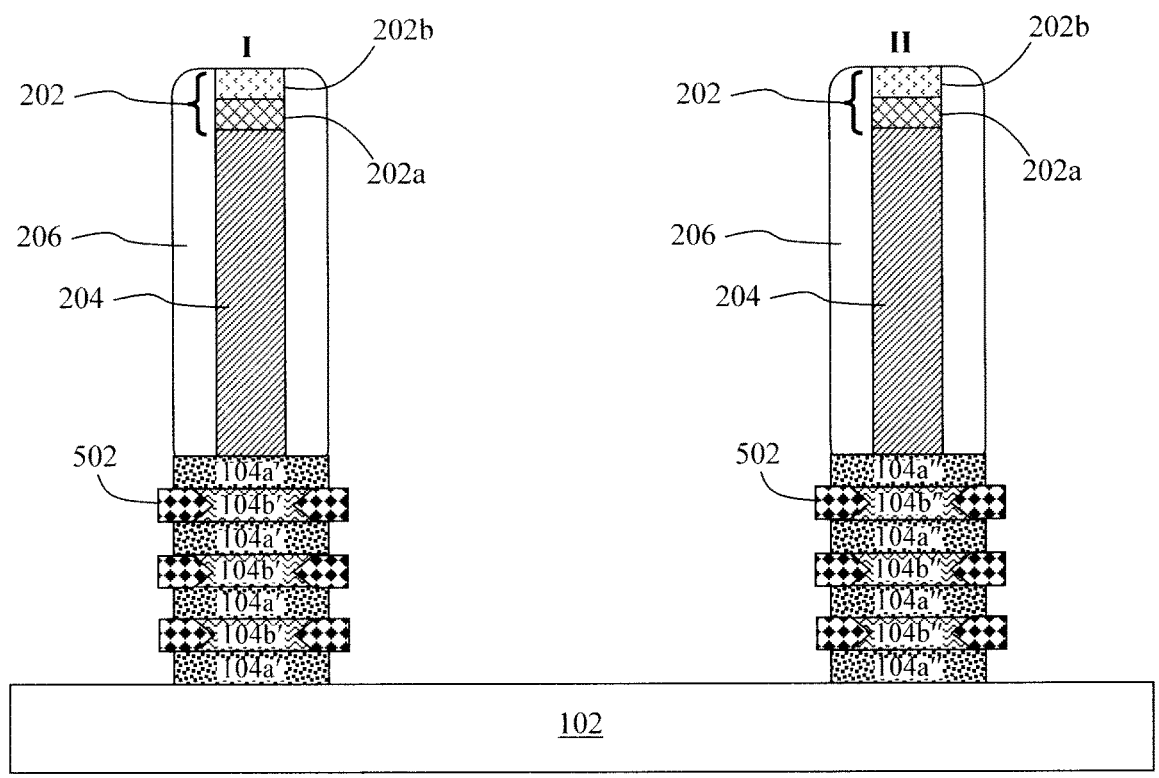
FIG. 5 is a cross-sectional diagram illustrating a strain-inducing material having been grown in the pockets according to an embodiment of the present invention.
Figure 6:
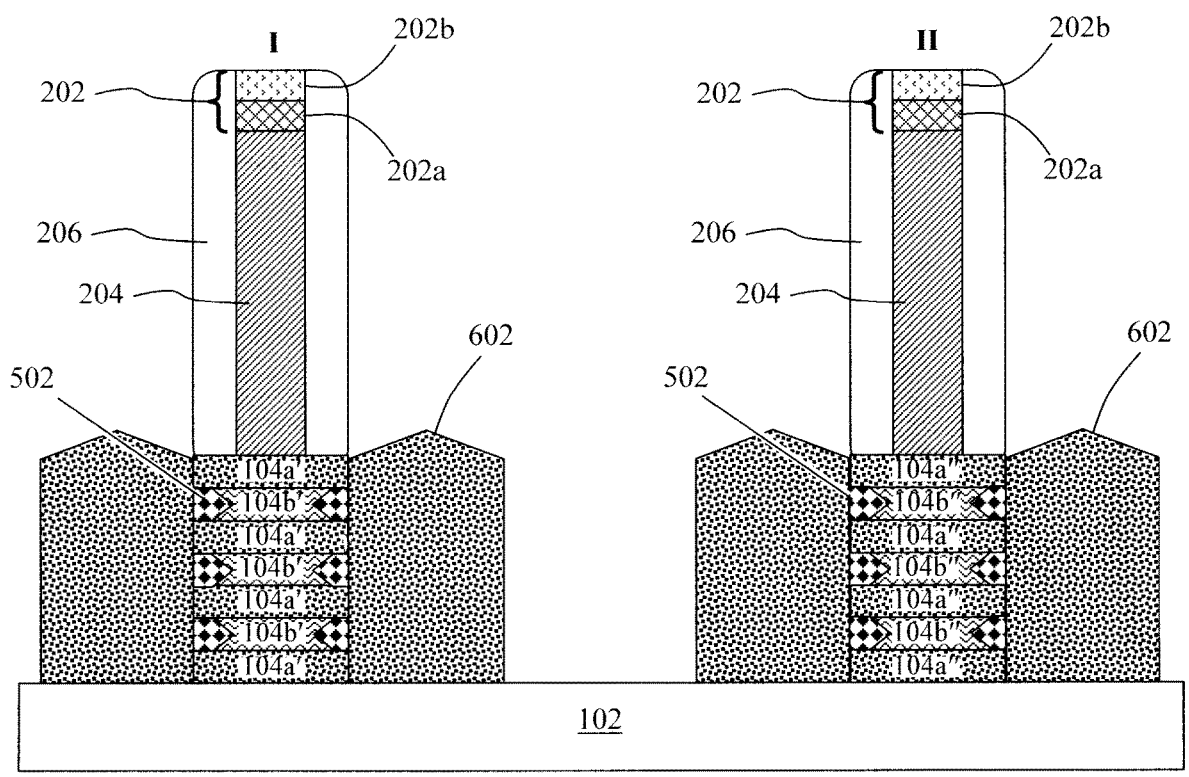
FIG. 6 is a cross-sectional diagram illustrating source and drains having been formed on opposite sides of the fin stacks according to an embodiment of the present invention.
Figure 7:
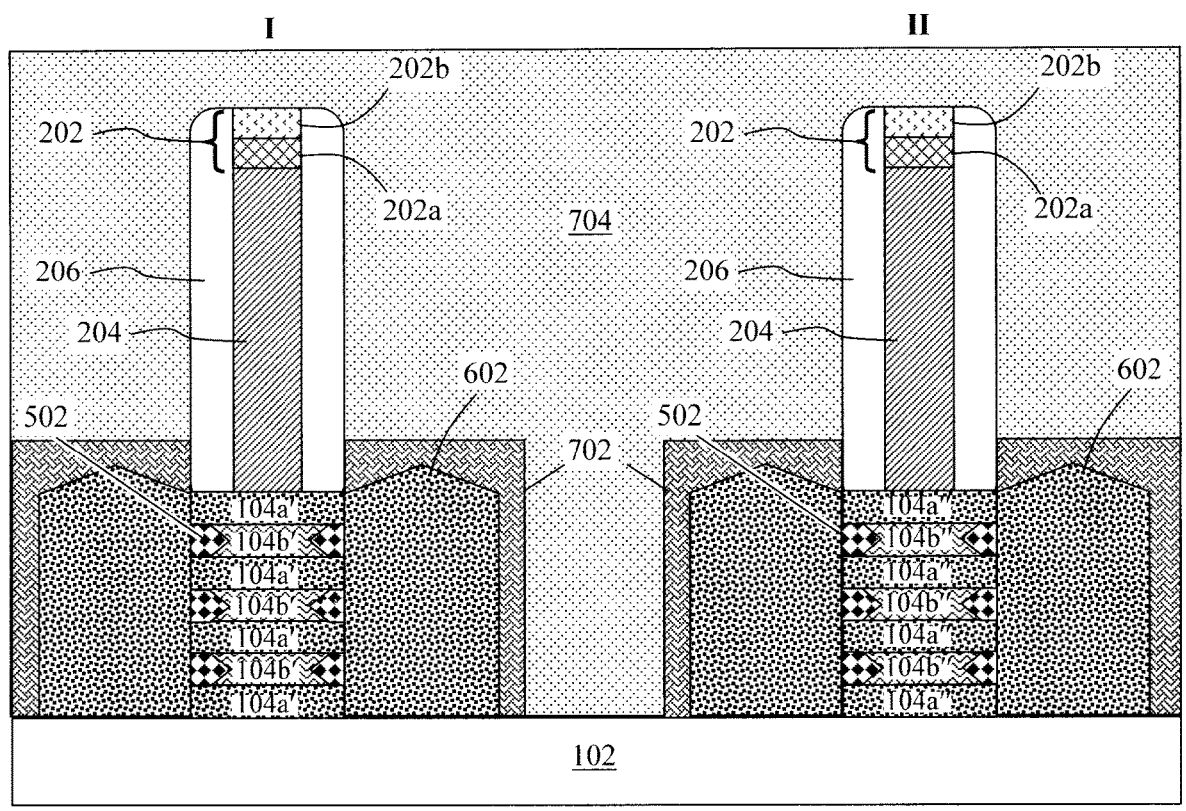
FIG. 7 is a cross-sectional diagram illustrating the source and drains having been covered in an etch stop layer, and the dummy gates having been buried in a dielectric material according to an embodiment of the present invention.
Figure 8:
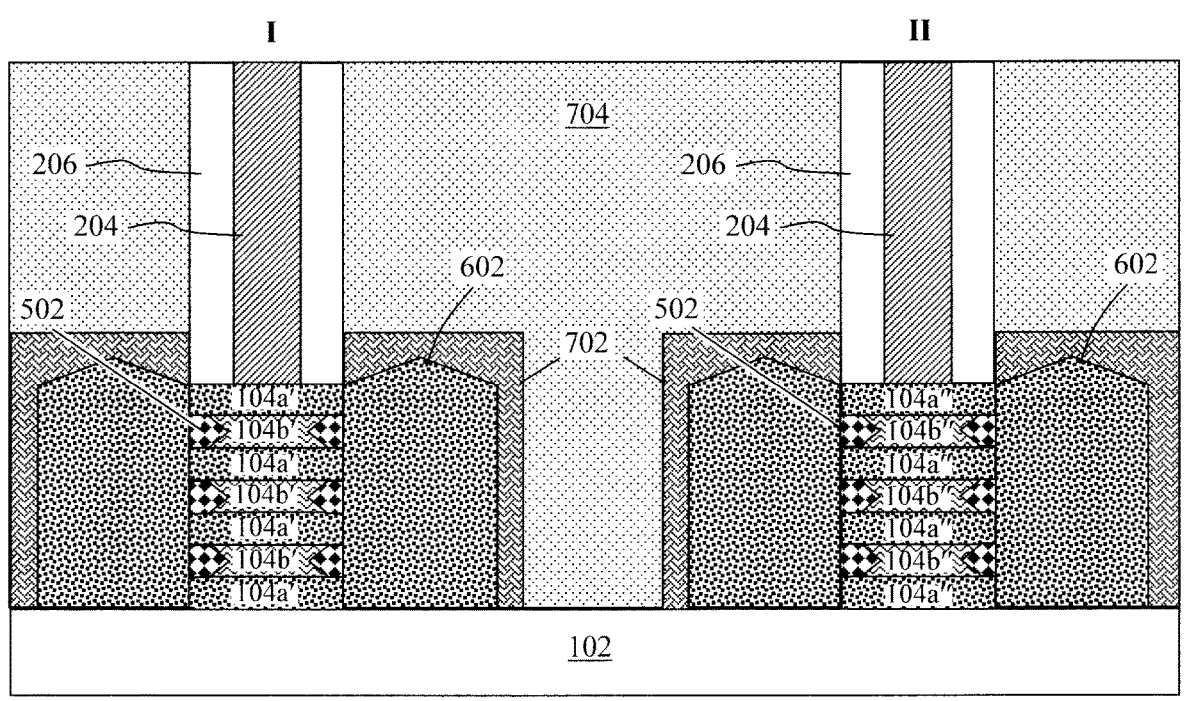
FIG. 8 is a cross-sectional diagram illustrating the dielectric material having been polished down to the dummy gates according to an embodiment of the present invention.

With the dummy gate(s) 204 and spacers 206 in place, the stack is then patterned into at least one individual tin stack beneath the dummy gates 204/spacers 206. See FIG. 3. As shown in FIG. 3, each fin stack will include patterned portions 104a',b', 104a",b", etc. of the nanosheets 104a and 104b. According to an exemplary embodiment, a directional etching process such as RIE is used to pattern the fin stacks.

A selective pull back of either the portions 104a'/104a" or the portions 104b'/104b" is next performed to form pockets in each of the fin stacks. See FIG. 4. As will be described in detail below, an epitaxial material can later be grown in the pockets so as to induce compressive strain in the channels. Alternatively, a strained dielectric can be also employed as a stressor material and inserted in the pockets. By way of example only, plasma enhanced chemical vapor deposition (PECVD) of dielectrics such as silicon dioxide ($SiO_2$) wherein the film stress is compressive, and silicon nitride (SiN) wherein the film stress is compressive can be employed. See, for example, K. D. Mackenzie et al., "Stress Control of Si-Based PECVD Dielectrics," Proc. Symp. Silicon Nitride and Silicon Dioxide Thin Insulating Films & Other Emerging Dielectrics VIII, PV2005-01, 148-159 (May 2005) (13 total pages), the contents of which are incorporated by reference as if fully set forth herein.

For illustrative purposes only, in this particular example the pull back is performed on portions 104b'/104b" (selective to 104a'/104a") in each of the fin stacks, selectively forming the pockets alongside the portions 104b'/104b" in each of the fin stacks. A selective etching process is used for the pull back. The specific etch employed will depend on the composition of the nanosheets. For instance, when portions 104a'/104a" are patterned from Si nanosheets and portions 104b'/104b" are patterned from SiGe nanosheets, then a SiGe-selective etch such as wet hot SC I, vapor phase hydrogen chloride (HCl), vapor phase chlorine trifluoride ($ClF_3$) and other reactive clean processes (RCP) can be used for a pull back performed on portions 104b'/104b" whereas a Si-selective etch such as $NH_4OH$ and/or TMAH ammonium hydroxide or TEAH can be used for a pull back performed on portions 104a'/104a".

The pockets are then filled with a strain-inducing material 502 that is, i.e., grown, deposited, etc. in the pockets. See FIG. 5. According to an exemplary embodiment, strain-inducing material 502 is an epitaxial material that is grown in the pockets. Alternatively, strain-inducing material 502 can be a compressive (e.g., PECVD-deposited $SiO_2$) or tensile (e.g., PECVD-deposited SiN)-strained dielectric stressor material that is deposited in the pockets.

For instance, with regard to an epitaxial strain-inducing material 502, when portions 104a'/104a" are patterned from Si nanosheets and portions 104b'/104b" are patterned from SiGe nanosheets, a SiGe epitaxial strain-inducing material 502 can be grown in the pockets. As highlighted above, in the case where SiGe is used both as the sacrificial nanosheet material and as the epitaxial strain-inducing material 502 in the pockets, a different Ge content is preferably employed in these layers to enable removal of the SiGe sacrificial nanosheets selective to the SiGe epitaxial strain-inducing material 502 during (in this case Si) channel release. Without such selectivity, the etch used on the SiGe sacrificial nanosheets would also undesirably remove the SiGe epitaxial strain-inducing material 502 and its strain imparting properties.

According to an exemplary embodiment, a lower-Ge content is employed in the SiGe nanosheets as compared to a higher-Ge content SiGe grown in the pockets. That way, during channel release, the lower-Ge content SiGe nanosheets can be removed selective to the higher-Ge content strain-inducing SiGe in the pockets and Si nanosheet channels. For instance, in one exemplary embodiment, the SiGe nanosheets have a (lower) Ge content of from about 30% Ge to about 60% Ge, and ranges therebetween, whereas the SiGe epitaxial strain-inducing material 502 grown in the pockets has a (higher) Ge content of from about 60% Ge to about 100% Ge (i.e., pure Ge), and ranges therebetween.

Epitaxial source and drains 602 are then formed on opposite sides of the fin stacks. See FIG. 6. In the exemplary embodiment depicted in FIG. 6, the source and drains 106 are formed from the same epitaxial material as portions 104b'/104b", e.g., SiGe. Etch selectivity between SiGe as the sacrificial material and as the material for the source and drains 602 is not a concern because removal of the sacrificial material will be performed only in the channel regions while the source and drains 602 remain covered/protected. Thus, according to an exemplary embodiment, the same (lower) Ge content SiGe as the nanosheets is used in the source and drains 602, e.g., SiGe having a Ge content of from about 30% Ge to about 60% Ge, and ranges therebetween.

The dummy gates 204 need to be removed in order to permit release of the channels from the fin stacks and ultimately to form gate-all-around (GAA) replacement metal gates surrounding the channels. To do so, the dummy gates 204 are buried in a dielectric material 704, such as an interlayer dielectric (ILD). See FIG. 7. Prior to depositing the dielectric material 704, the source and drains 602 can optionally be covered with an etch stop layer 702. Layer 702 will serve as an etch stop during subsequent processes involved in patterning the dielectric material 704, such as when forming contacts to the source and drains 602. Suitable materials for the etch stop layer 702 include, but are not limited to, SiN, SiBCN, SiOCN, and/or SiCN.

The dielectric material 704 is then polished down to the tops of the dummy gates 204, and in the process removing the dummy gate hardmasks 202. See FIG. 8. According to an exemplary embodiment, this polishing step is performed using a process such as chemical-mechanical polishing (CMP). Now that the tops of the dummy gates 204 are exposed, the dummy gates 204 can be removed selective to the dielectric material 704, followed by channel release and replacement gates formation.

As highlighted above, the instant example involves forming multiple nanosheet devices concurrently on the same wafer. It further illustrates how different channel materials can be implemented in these devices, i.e., nanosheets 104a (e.g., SiGe nanosheets) serve as the channels in at least one device, while nanosheets 104b (e.g., Si nanosheets) serve as the channels in at least one other device. For illustrative purposes only, in the description that follows the nanosheet device I will have SiGe channels, while the nanosheet device II will have Si channels.

Several different approaches are contemplated herein for implementing the replacement gate process in the context of these multiple device/multiple channel material embodiments. In one approach (illustrated in FIGS. 9-16), one type of device (e.g., the Si channel device(s)) is masked while the dummy gate removal, channel release and replacement gate formation steps are performed in the other type of device (e.g., the SiGe channel device(s)), and vice versa. In another approach (illustrated in FIGS. 17-24), the dummy gate removal is performed prior to selectively masking one type of device, while the channel release and replacement gate formation is performed in the other, and vice versa.

Figure 9:
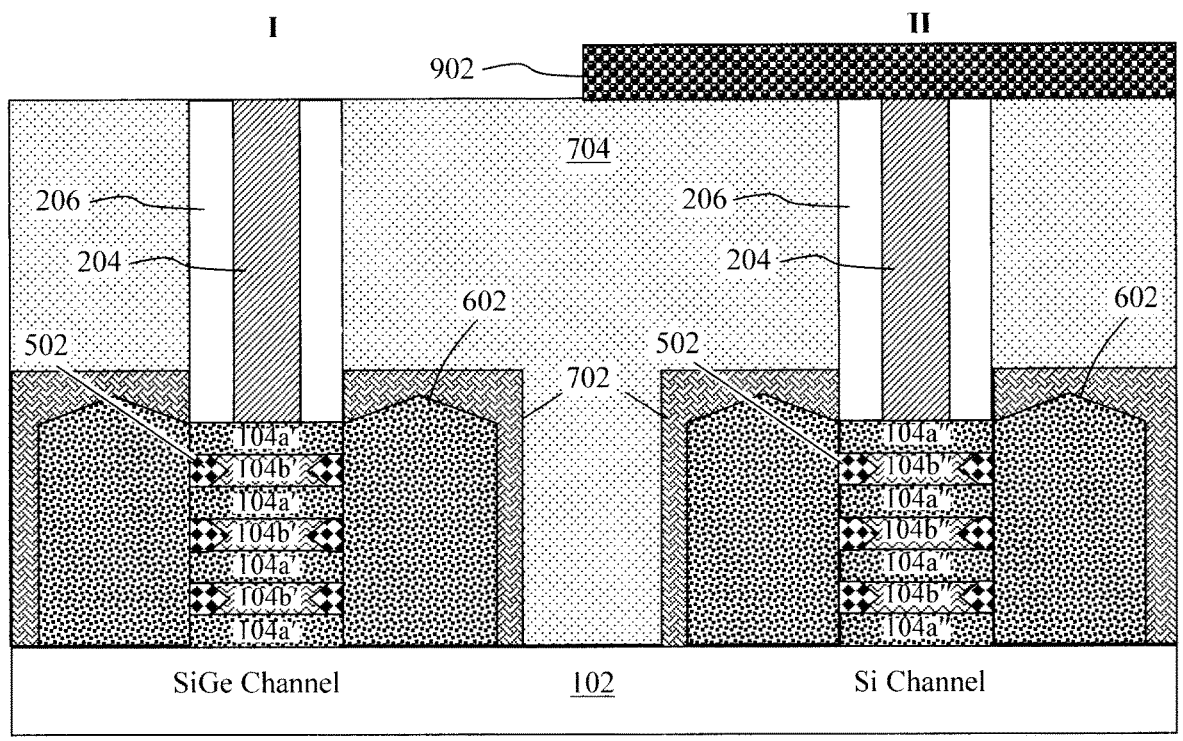
FIG. 9 is a cross-sectional diagram illustrating a block mask having been formed covering the second dummy gate according to an embodiment of the present invention.
Figure 10:
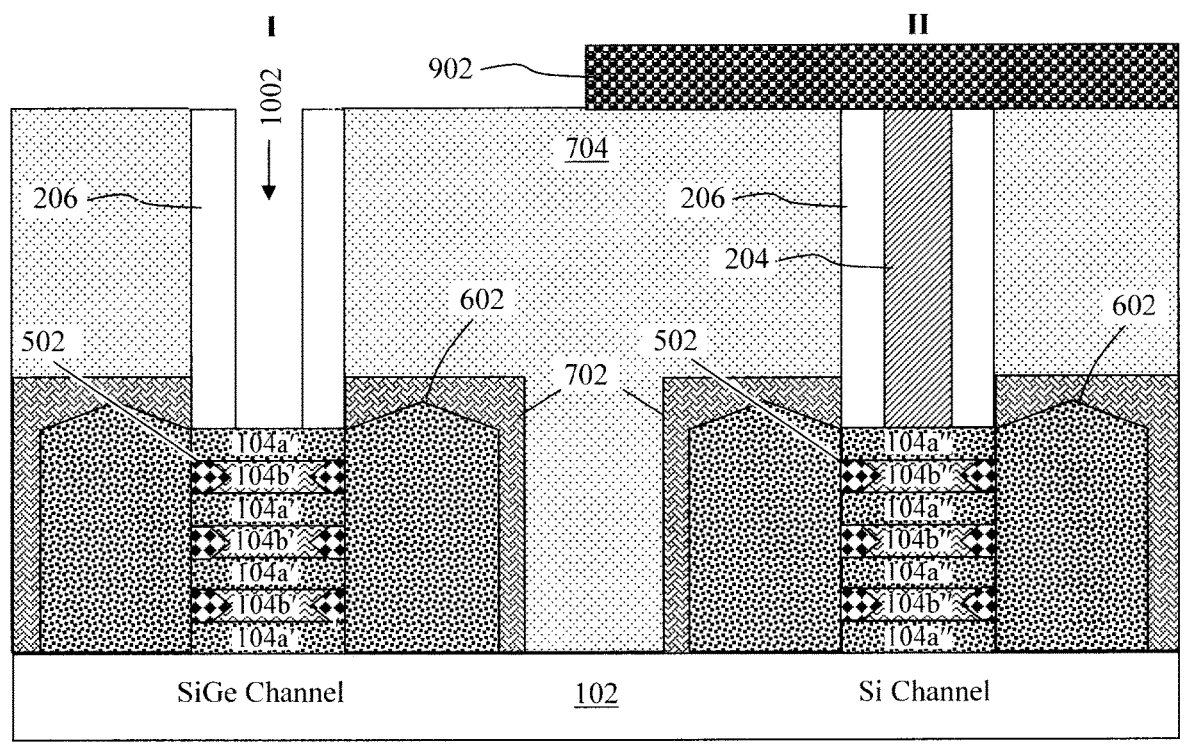
FIG. 10 is a cross-sectional diagram illustrating the first dummy gate having been removed forming a first gate trench in the dielectric material according to an embodiment of the present invention.
Figure 11:
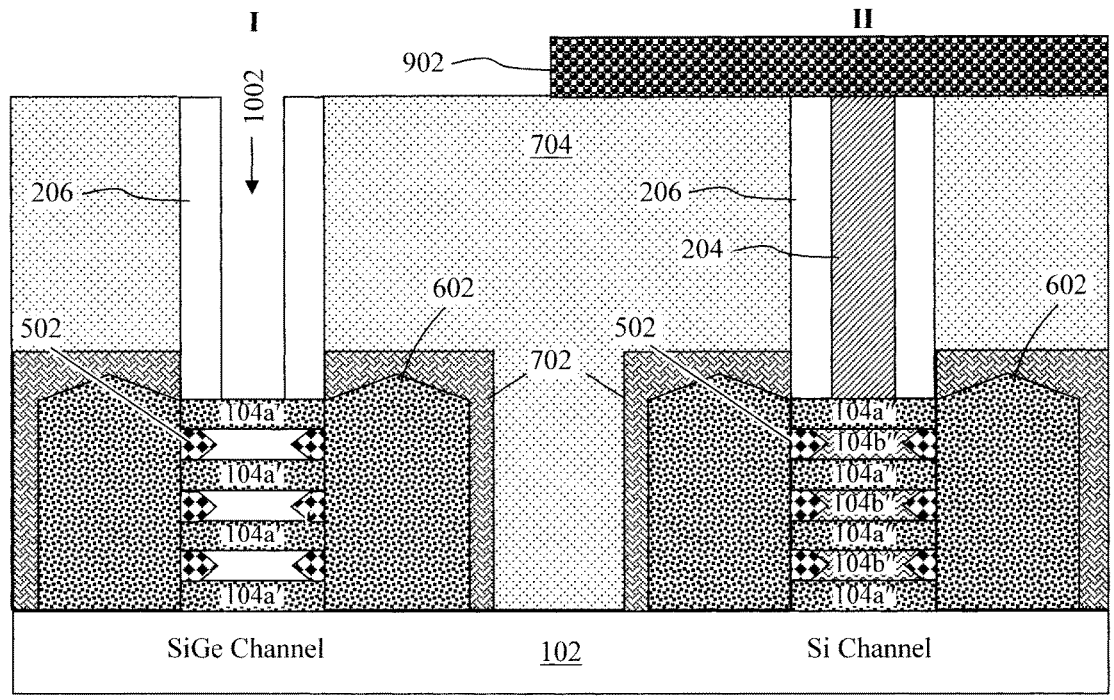
FIG. 11 is a cross-sectional diagram illustrating the second nanosheets having been selectively removed from the first fin stack through the first gate trench according to an embodiment of the present invention.

Thus, with regard to the first approach, a block mask 902 is formed on the (polished) dielectric material 704, covering/masking the dummy gate 204 over the Si channel device II. See FIG. 9. Suitable block mask materials include, but are not limited to, organic planarizing (OPL) materials. As shown in FIG. 9, the top of the dummy gate 204 over the fin stack of the SiGe channel device I remains exposed. An etch, such as a Si-selective RIE or wet etching process is then used to selectively remove the dummy gate 204 from the SiGe channel device I, forming a gate trench 1002 in the dielectric material 704 over the fin stack of the SiGe channel device I. See FIG. 10.

An etch performed through the gate trench 1002 is then used to selectively remove the sacrificial layers from the fin stack. See FIG. 11. In the case of the SiGe channel device I, the Si (sacrificial) portions 104b' are removed at this step which releases the SiGe (channel) portions 104a' from the fin stack. By 'released' it is meant that the layers are removed from above and below the SiGe (channel) portions 104a' thereby providing access all around each of the SiGe (channel) portions 104a'. A Si-selective etch such as NH$_4$OH, TEAH and/or TMAH can be used to remove the Si (sacrificial) portions 104b' from the fin stack of the SiGe channel device I.

At the point that the Si (sacrificial) portions 104b' are removed from the fin stack, the channel strain induced by the strain-inducing material 502 is maintained since the SiGe (channel) portions 104a' are clamped on both ends by the source and drains 602. Further, the epitaxial material in the source and drains 602 is also compressive. Thus, the strain in the SiGe (channel) portions 104a' is further enhanced when the channels are released from the fin stack since they are no longer being constrained above and below by the sacrificial layers.

Figure 12:
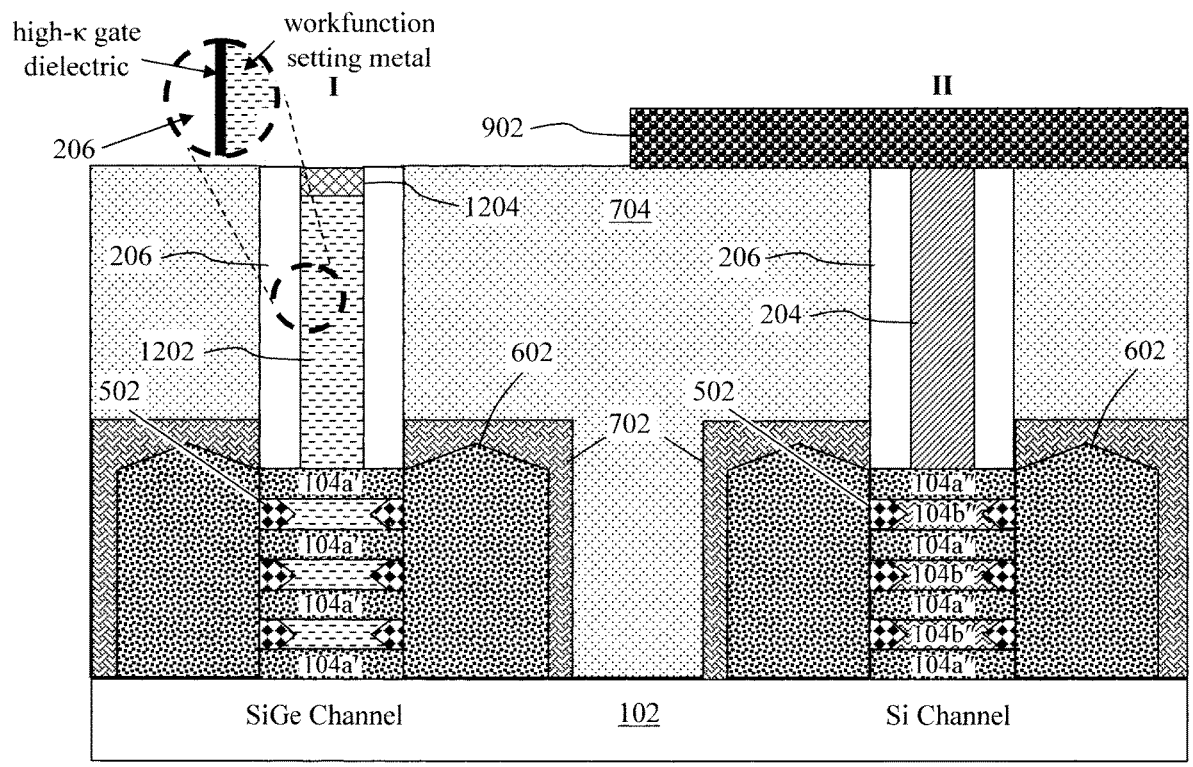
FIG. 12 is a cross-sectional diagram illustrating a first replacement gate having been formed in the first gate trench that surrounds the first nanosheets in a gate-all-around configuration according to an embodiment of the present invention.

Next, as shown in FIG. 12, a replacement gate 1202 is formed in the gate trench 1002. As shown in FIG. 12, based on the SiGe (channel) portions 104a' having been released from the stack, the replacement gate 1202 fully surround a portion of each of the SiGe (channel) portions 104a' in a gate-all-around or GAA configuration. As also shown in FIG. 12, according to an exemplary embodiment the replacement gate 1202 includes a high-K metal gate stack having a high-K gate dielectric and a workfunction setting metal over the high-K gate dielectric. A gate cap 1204 is formed over the replacement gate. The gate cap 1204 serves to protect the replacement gate 1202 during subsequent processing. Suitable materials for the gate cap 1204 include, but are not limited to, nitride capping materials such as silicon nitride (SiN).

The particular workfunction setting metal employed can vary depending on whether an NFET (n-type workfunction setting metal) or PFET (p-type workfunction setting metal) is being formed. Suitable n-type workfunction setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction setting metals include, but are not limited to, TiN, TaN, and tungsten (W). TiN and TaN are relatively thick (e.g., greater than about 2 nanometers (nm)) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

The term "high-κ" as used herein refers to a material having a relative dielectric constant K which is much higher than that of silicon dioxide (e.g., a dielectric constant K=25 for hafnium oxide ($HfO_2$) rather than 4 for silicon dioxide). Suitable high-K gate dielectrics include, but are not limited to, $HfO_2$ and/or lanthanum oxide ($La_2O_3$).

Figure 13:
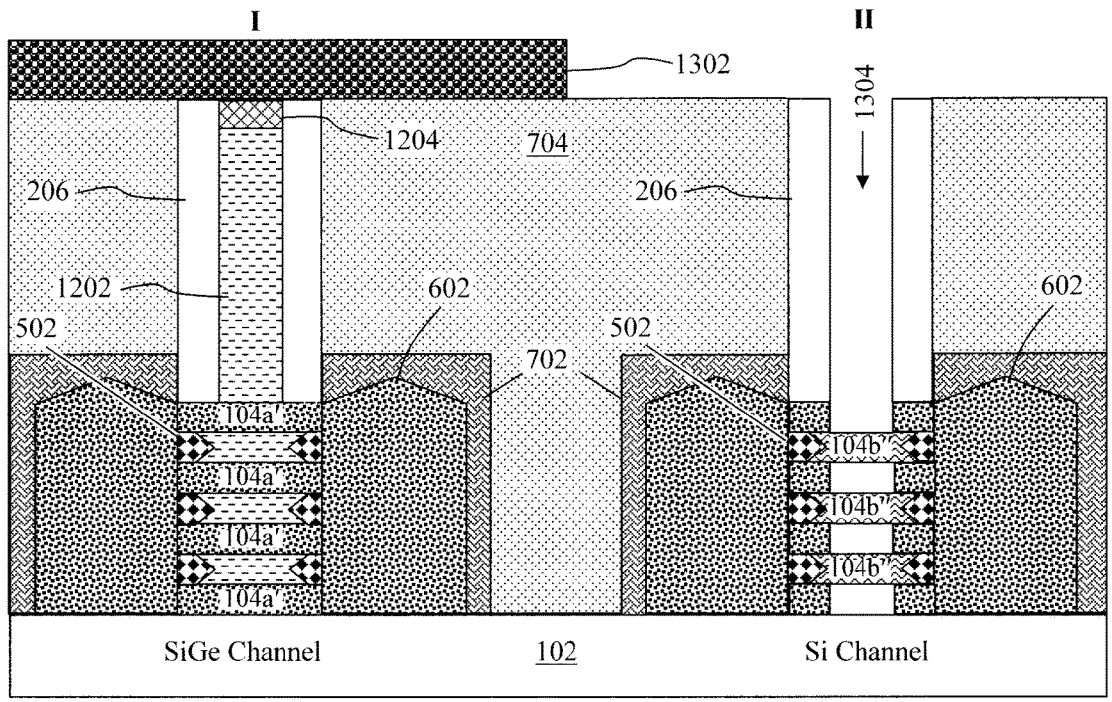
FIG. 13 is a cross-sectional diagram illustrating a block mask having been formed covering the first replacement gate, the second dummy gate having been removed forming a second gate trench in the dielectric material, and the first nanosheets having been selectively removed from the second fin stack through the second gate trench according to an embodiment of the present invention.

The block mask 902 is then removed, and the process is repeated for the second nanosheet device(s) I. Namely, as shown in FIG. 13, a block mask 1302 is formed on the dielectric material 704 selectively covering/masking the replacement gate 1202 over the SiGe channel device I. This permits an etch, such as an Si-selective RIE or wet etching process, to be used to selectively remove the dummy gate 204 from the Si channel device II, forming a gate trench 1304 in the dielectric material 704 over the fin stack of the Si channel device II.

In the same manner as above, an etch performed through the gate trench 1304 is then used to selectively remove the sacrificial layers from the fin stack. In the case of the Si channel device II, the SiGe (sacrificial) portions 104a" are removed at this step which releases the Si (channel) portions 104b" from the fin stack. As described above, for an epitaxial strain-inducing material 502, an etch selectivity for the lower Ge content (i.e., from about 30% Ge to about 60% Ge) in the SiGe nanosheets over the higher Ge content (i.e., from about 60% Ge to about 100% Ge) in the strain-inducing SiGe grown in the pockets is leveraged to selectively remove the SiGe (sacrificial) portions 104a" from the fin stack of the Si channel device II (selective to the strain-inducing material 502 in the pockets and the Si nanosheets). As provided above, suitable Ge content-selective etchants include, but are not limited to, $NH_4OH$, TEAH and/or TMAH. Similarly, etch selectivity of the SiGe (sacrificial) portions 104a" relative to a dielectric strain-inducing material 502 can be achieved via a SiGe-selective etchant such as wet hot SC1, vapor phase HCl, vapor phase $ClF_3$ and other reactive clean processes (RCP). The strain-inducing material 502 on the opposite ends of the Si (channel) portions 104b" maintains the channel strain which, as provided above, is further enhanced when the channels are released from the fin stack since they are no longer being constrained above and below by the sacrificial layers.

Figure 14:
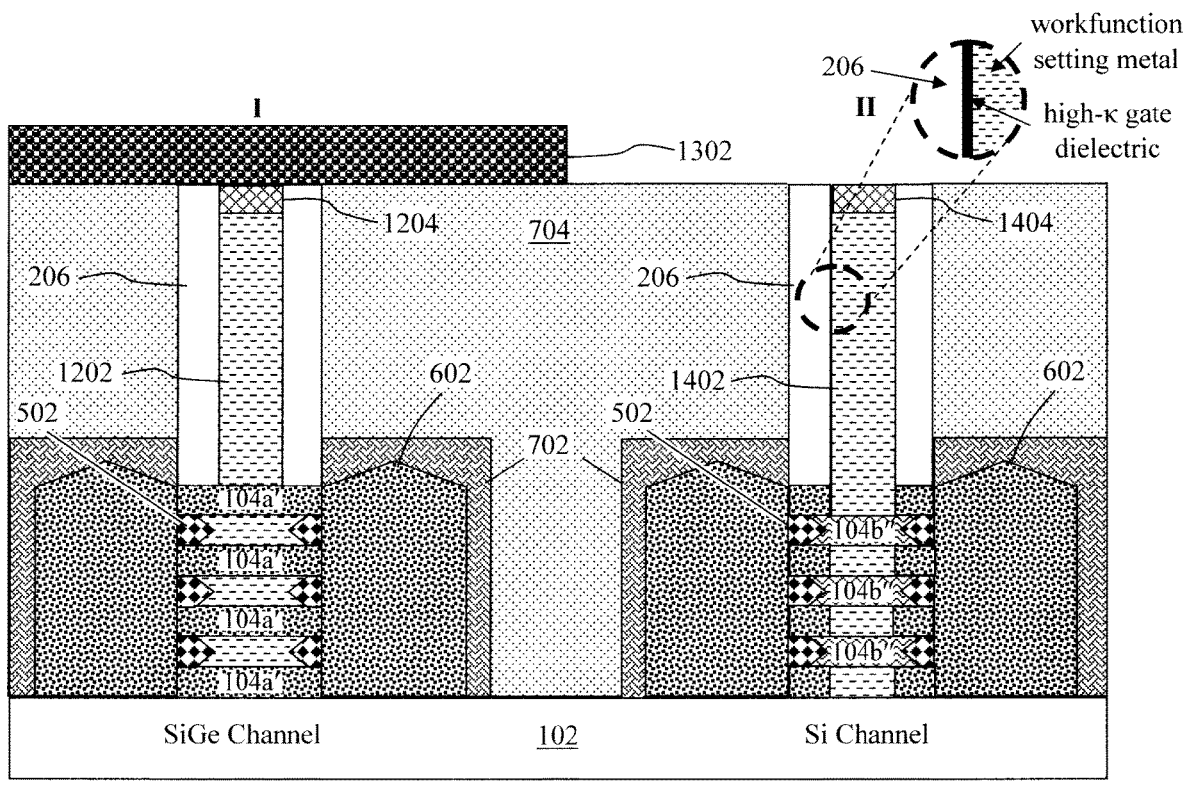
FIG. 14 is a cross-sectional diagram illustrating a second replacement gate having been formed in the second gate trench that surrounds the second nanosheets in a gate-all-around configuration according to an embodiment of the present invention.

Next, as shown in FIG. 14, a replacement gate 1402 is formed in the gate trench 1304. As shown in FIG. 14, based on the Si (channel) portions 104b" having been released from the stack, the replacement gate 1402 fully surrounds a portion of each of the Si (channel) portions 104b" in a gate-all-around (GAA) configuration. As also shown in FIG. 14, according to 'an exemplary embodiment the replacement gate 1402 includes a high-κ metal gate stack having a high-κ gate dielectric and a workfunction setting metal over the high-κ gate dielectric. A gate cap 1404 is formed over the replacement gate 1402. Suitable capping materials, high-κ gate dielectrics and workfunction setting metals were provided above.

Figure 15:
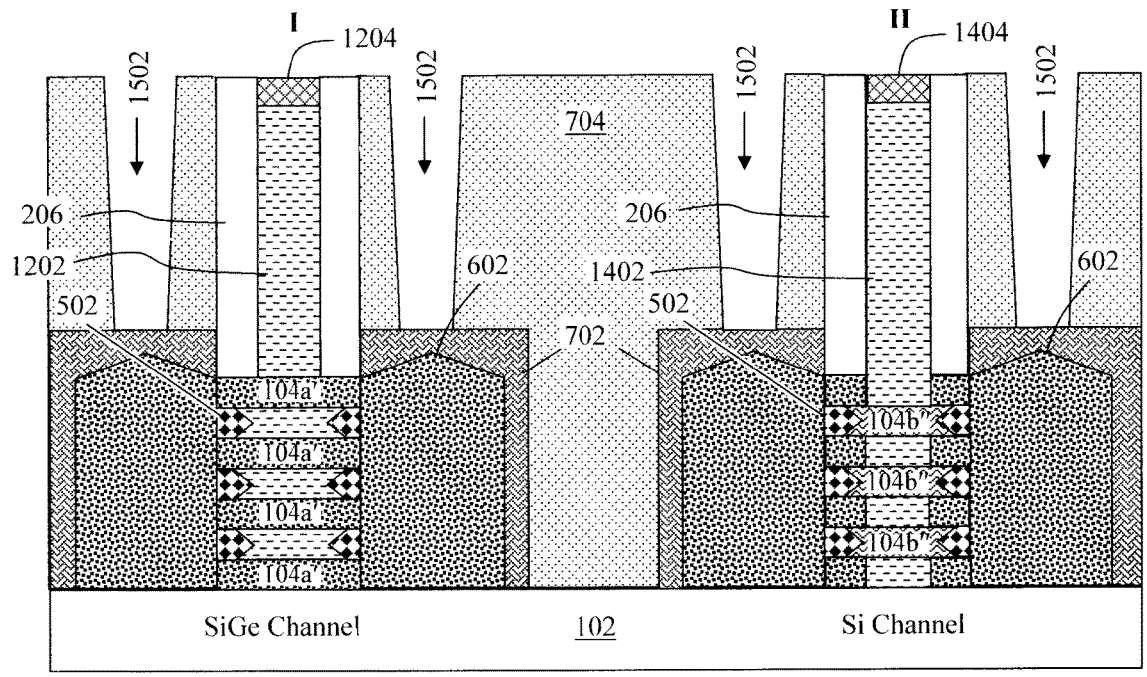
FIG. 15 is a cross-sectional diagram illustrating contact trenches having been patterned in the dielectric material down to the etch stop layer over the source and drains according to an embodiment of the present invention.
Figure 16:
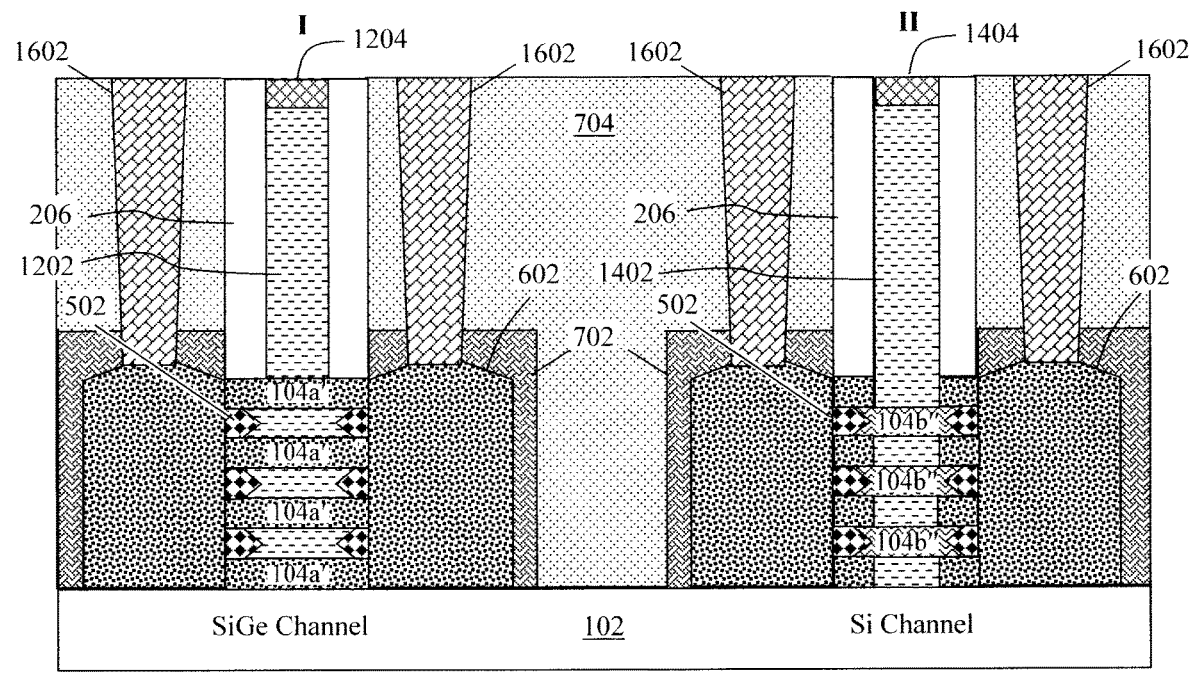
FIG. 16 is a cross-sectional diagram illustrating the contact trenches having been extended through the etch stop layer and down to the source and drains, and the contact trenches having been filled with a contact metal according to an embodiment of the present invention.

The block mask 1302 is then removed. Any further processing can then be performed as necessary to complete the device. For instance, contacts can be formed to the source and drains 602. To do so, contact trenches 1502 are patterned in the dielectric material 704. See FIG. 15. As shown in FIG. 15, a first etch step can be employed to form the contact trenches 1502 down to the etch stop layer 702, which is in place over the source and drains 602. A second etch step, which is more finely controlled than the first, can then be used to extend the contact trenches 1502 through the etch stop layer 702 and down to the source and drains 602. See FIG. 16. As shown in FIG. 16, the contact trenches 1502 are then filled with a contact metal(s) 1602. Suitable contact metals include, but are not limited to, copper (Cu), nickel (Ni), platinum (Pt) and/or palladium (Pd).

Figure 17:
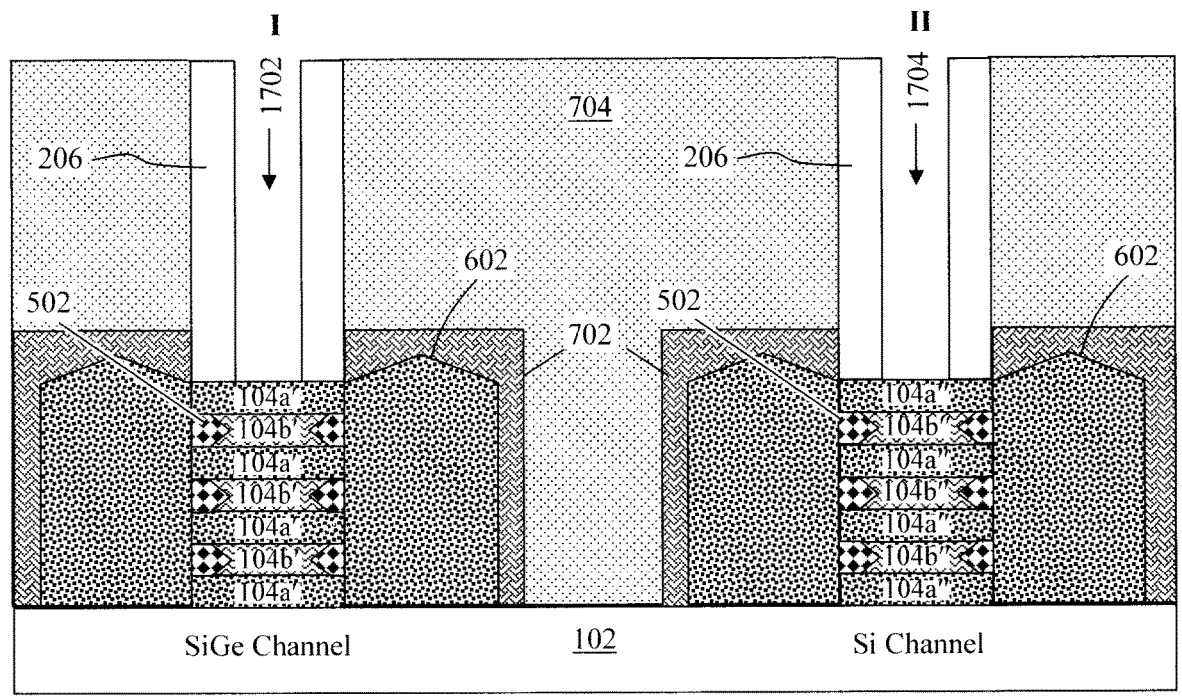
FIG. 17 is a cross-sectional diagram illustrating, according to an alternative embodiment which follows from FIG. 8, the first and second dummy gates having been removed forming first and second gate trenches in the dielectric material according to an embodiment of the present invention.

As highlighted above, another approach contemplated herein for the replacement gate process involves first pulling both dummy gates and then selectively masking each device in turn, while the channel release and replacement gate formation is performed in the other. The same steps described in conjunction with the description of FIGS. 1-8 are performed, and this alternative approach begins as shown in FIG. 17 (which follows from FIG. 8) with the dummy gates 204 having been removed (e.g., via a Si-selective RIE or wet etching process) from the SiGe channel device I and the Si channel device II, forming gate trenches 1702 and 1704 in the dielectric material 704 over the fin stacks of the SiGe channel device I and the Si channel device II, respectively.

Figure 18:
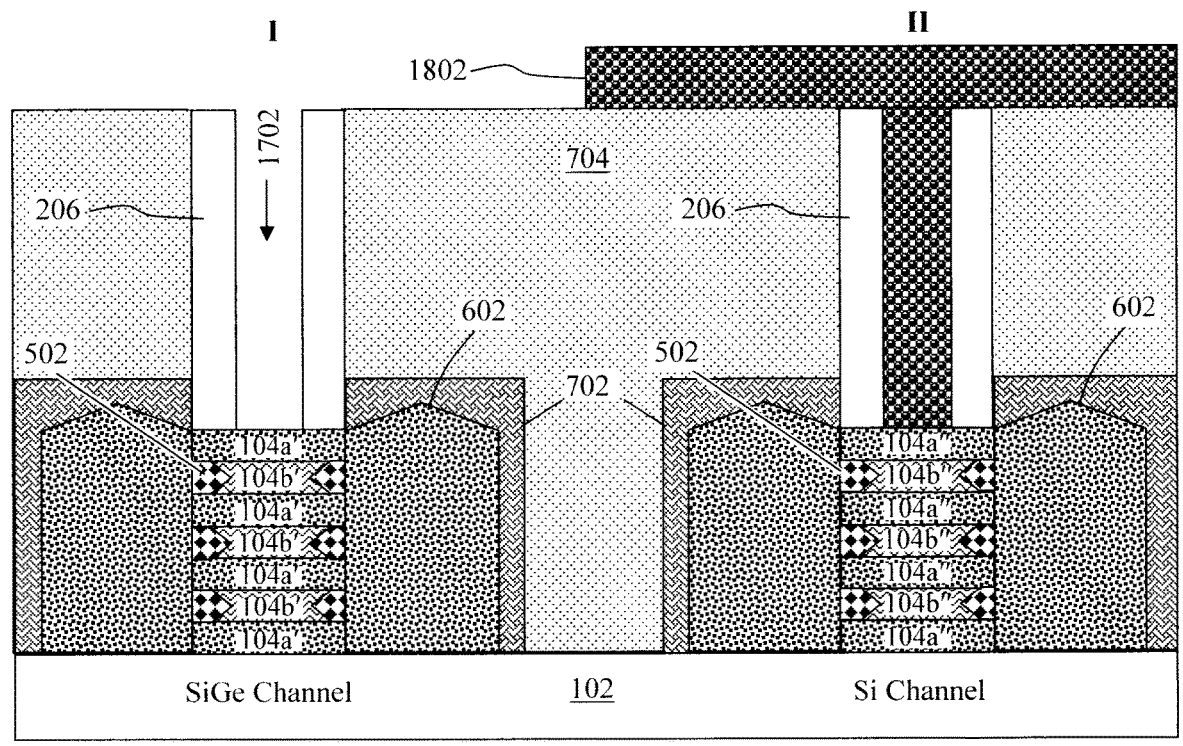
FIG. 18 is a cross-sectional diagram illustrating a block mask having be formed covering the second gate trench according to an embodiment of the present invention.
Figure 19:
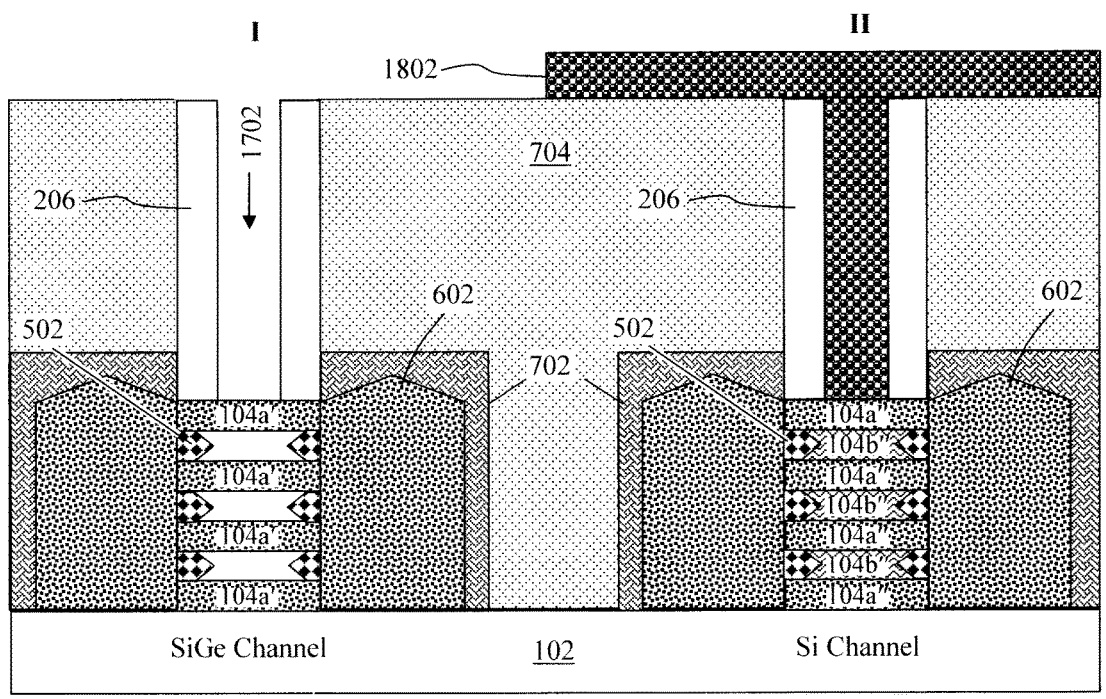
FIG. 19 is a cross-sectional diagram illustrating the second nanosheets having been selectively removed from the first fin stack through the first gate trench according to an embodiment of the present invention.

A block mask 1802 is then formed covering/masking the gate trench 1704 over the Si channel device II. See FIG. 18. As shown in FIG. 18, the gate trench 1702 over the fin stack of the SiGe channel device I remains open. An etch performed through the gate trench 1702 is then used to selectively remove the sacrificial layers from the fin stack of the SiGe channel device I. See FIG. 19. In the case of the SiGe channel device I, the Si (sacrificial) portions 104b' are removed at this step which releases the SiGe (channel) portions 104a' from the fin stack.

As described above, at the point that the Si (sacrificial) portions 104b' are removed from the fin stack, the channel strain induced by the strain-inducing material 502 is maintained since the SiGe (channel) portions 104a' are clamped on both ends by the source and drains 602. Further, the epitaxial material in the source and drains 602 is also compressive. Thus, the strain in the SiGe (channel) portions 104a' is further enhanced when the channels are released from the fin stack since they are no longer being constrained above and below by the sacrificial layers.

Figure 20:
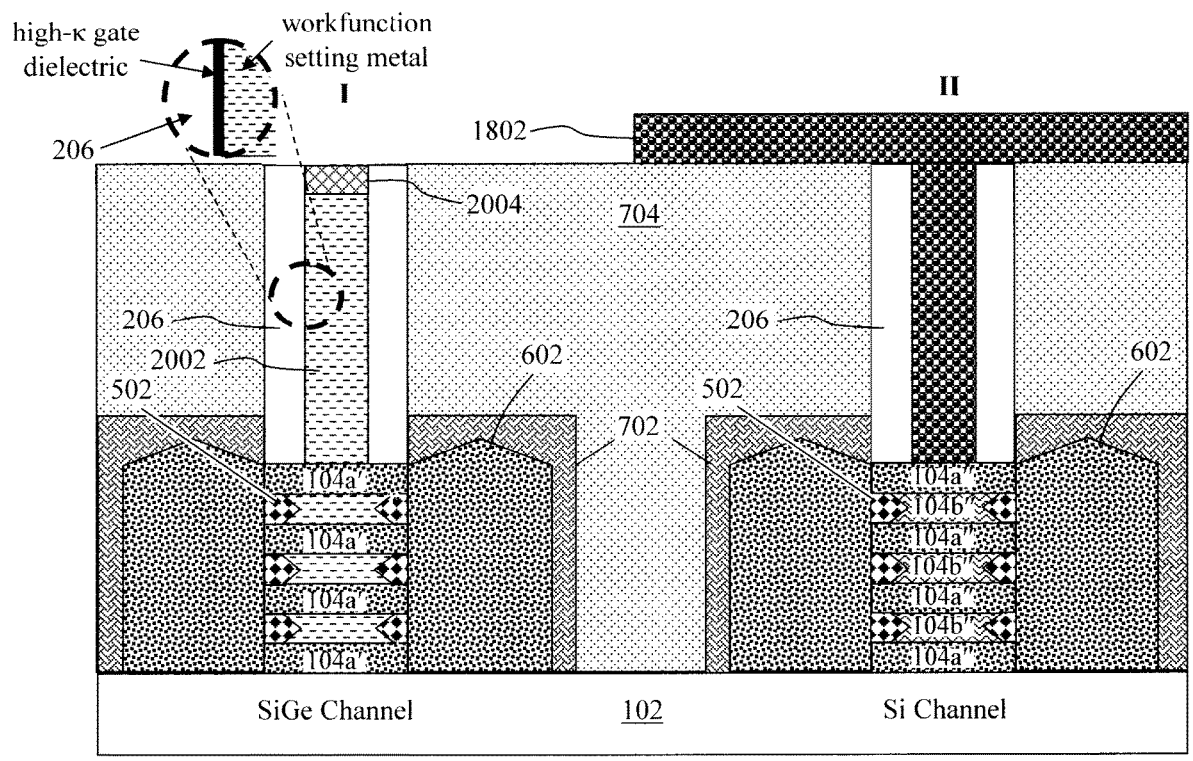
FIG. 20 is a cross-sectional diagram illustrating a first replacement gate having been formed in the first gate trench that surrounds the first nanosheets in a gate-all-around configuration according to an embodiment of the present invention.

Next, as shown in FIG. 20, a replacement gate 2002 is formed in the gate trench 1702. As shown in FIG. 20, based on the SiGe (channel) portions 104a' having been released from the stack, the replacement gate 2002 fully surrounds a portion of each of the SiGe (channel) portions 104a' in a gate-all-around or GAA configuration. As also shown in FIG. 20, according to an exemplary embodiment the replacement gate 2002 includes a high-κ metal gate stack having a high-κ gate dielectric and a workfunction setting metal over the high-κ gate dielectric. A gate cap 2004 is formed over the replacement gate. Suitable capping materials, high-κ gate dielectrics and workfunction setting metals were provided above.

Figure 21:
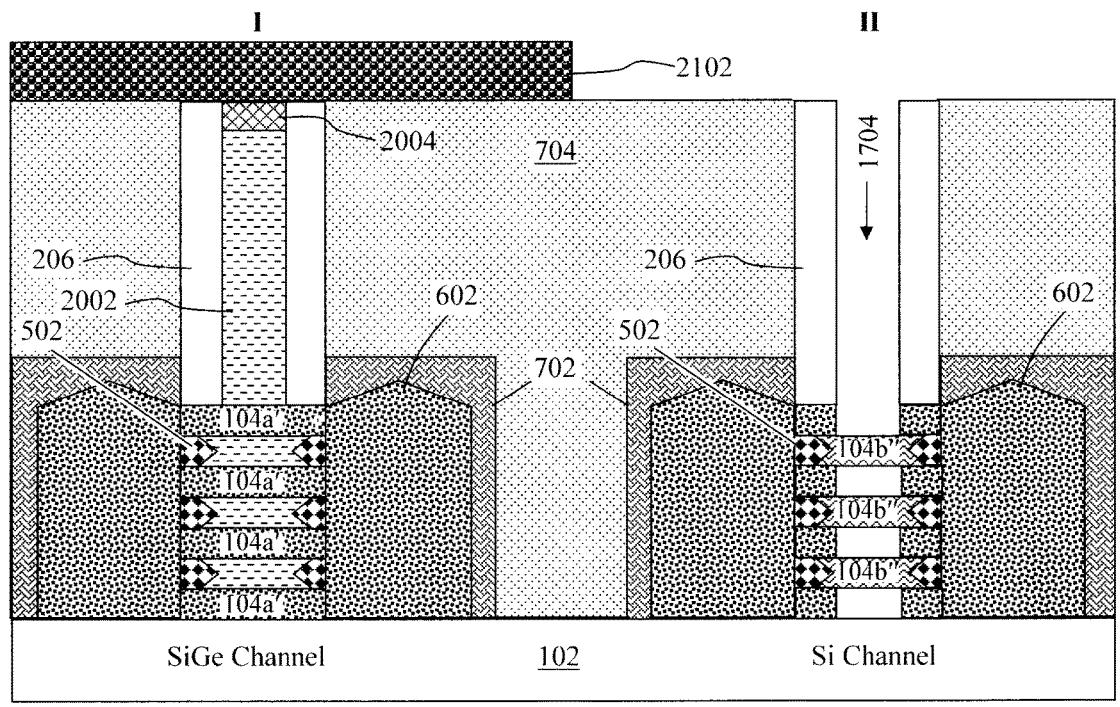
FIG. 21 is a cross-sectional diagram illustrating a block mask having been formed covering the first replacement gate, and the first nanosheets having been selectively removed from the second fin stack through the second gate trench according to an embodiment of the present invention.

The block mask 1802 is then removed, and the process is repeated for the second nanosheet device(s) II. Namely, as shown in FIG. 21, a block mask 2102 is formed on the dielectric material 704 selectively covering/masking the replacement gate 2002 over the SiGe channel device I, leaving the gate trench 1704 open.

In the same manner as above, the SiGe (sacrificial) portions 104a" are removed from the fin stack of the Si channel device II. As described above, for an epitaxial strain-inducing material 502, an etch selectivity for the lower Ge content (i.e., from about 30% Ge to about 60% Ge) in the SiGe nanosheets over the higher Ge content (i.e., from about 60% Ge to about 100% Ge) in the strain-inducing SiGe grown in the pockets is leveraged to selectively remove the SiGe (sacrificial) portions 104a" from the fin stack of the Si channel device II (selective to the strain-inducing material 502 in the pockets and the Si nanosheets). As provided above, suitable Ge content-selective etchants include, but are not limited to, $NH_4OH$, TEAH and/or TMAH. Similarly, etch selectivity of the SiGe (sacrificial) portions 104a" relative to a dielectric strain-inducing material 502 can be achieved via a SiGe-selective etchant such as wet hot SCl, vapor phase HCl, vapor phase $ClF_3$ and other reactive clean processes (RCP). The strain-inducing material 502 on the opposite ends of the Si (channel) portions 104b" maintains the channel strain which, as provided above, is further enhanced when the channels are released from the fin stack since they are no longer being constrained above and below by the sacrificial layers.

Figure 22:
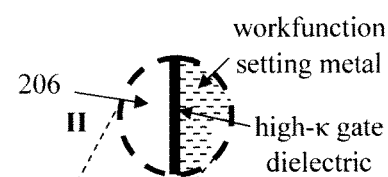
FIG. 22 is a cross-sectional diagram illustrating a second replacement gate having been formed in the second gate trench that surrounds the second nanosheets in a gate-all-around configuration according to an embodiment of the present invention.
Figure 22:
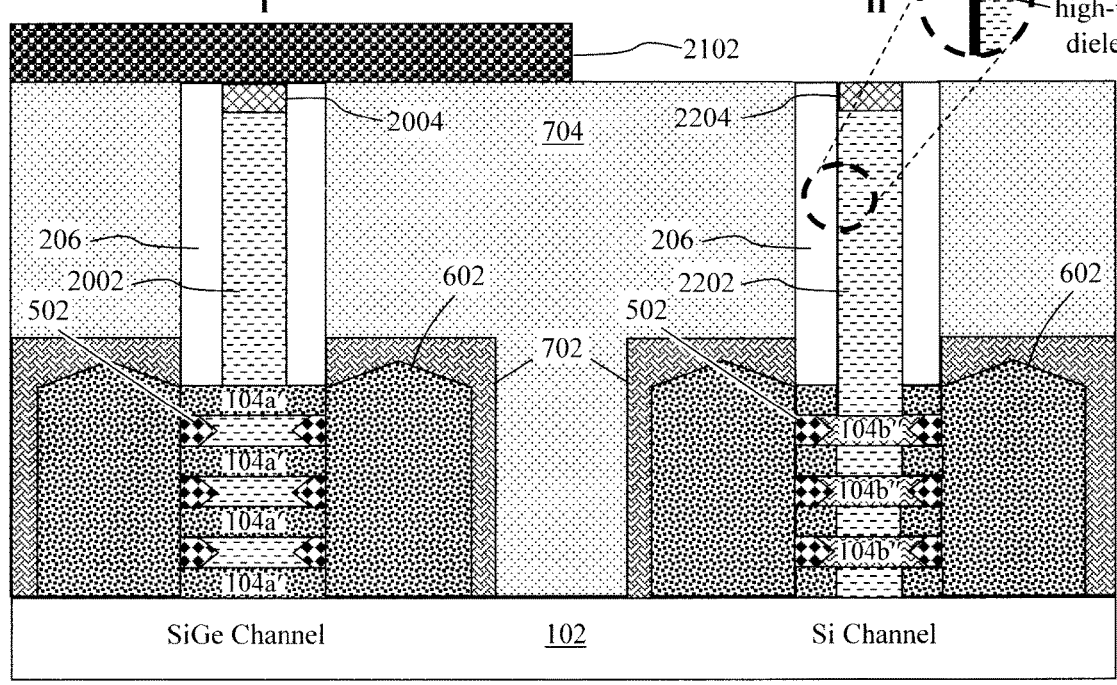

Next, as shown in FIG. 22, a replacement gate 2202 is formed in the gate trench 1704. As shown in FIG. 22, based on the Si (channel) portions 104b" having been released from the stack, the replacement gate 2202 fully surrounds a portion of each of the Si (channel) portions 104b" in a gate-all-around (GAA) configuration. As also shown in FIG. 22, according to an exemplary embodiment the replacement gate 2202 includes a high-κ metal gate stack having a high-κ gate dielectric and a workfunction setting metal over the high-κ gate dielectric. A gate cap 2204 is formed over the replacement gate. Suitable capping materials, high-κ gate dielectrics and workfunction setting metals were provided above.

Figure 23:
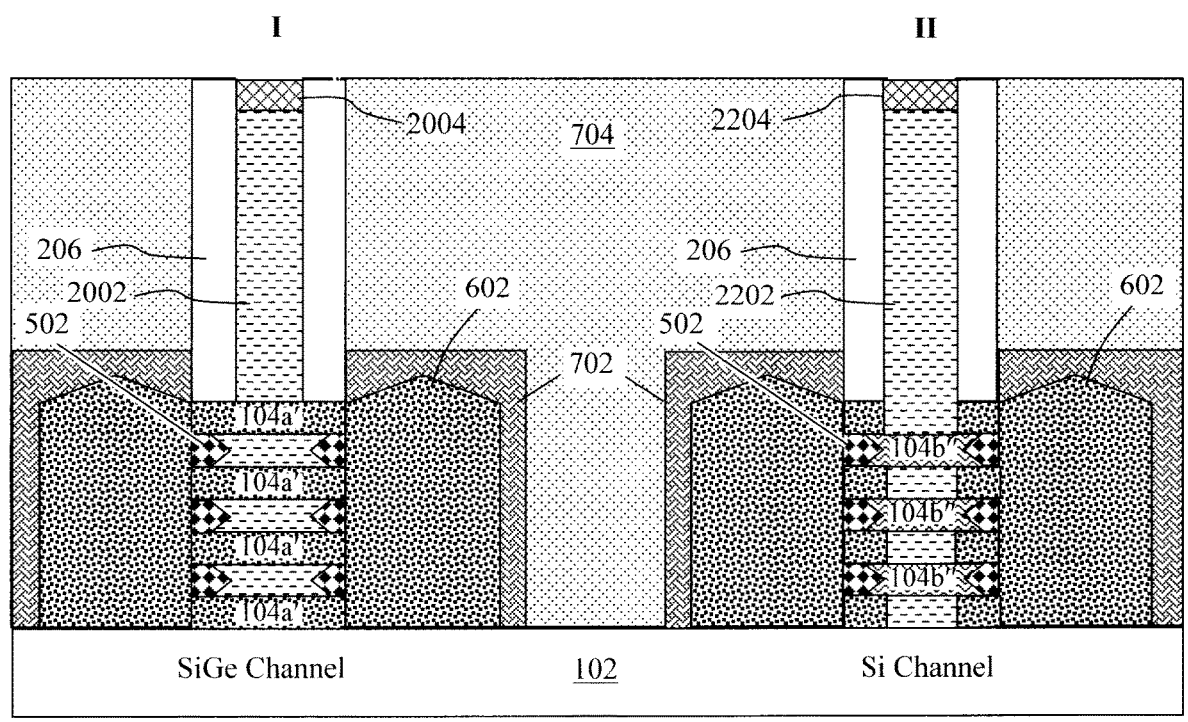
FIG. 23 is a cross-sectional diagram illustrating the block mask having been removed according to an embodiment of the present invention.

As shown in FIG. 23, the block mask 2102 is then removed. Any further processing can then be performed as necessary to complete the device (e.g., source and drain contacts can be formed in the same manner as described in conjunction with the description of FIGS. 15 and 16, above).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a nanosheet device, the method comprising the steps of:
    forming an alternating series of first nanosheets comprising a first material and second nanosheets comprising a second material as a stack on a wafer;
    forming at least one dummy gate on the stack;
    forming spacers along opposite sidewalls of the at least one dummy gate;
    patterning the stack into at least one fin stack beneath the at least one dummy gate;
    etching the at least one fin stack to selectively pull back the second nanosheets in the at least one fin stack forming pockets in the at least one fin stack;
    filling the pockets with a strain-inducing material comprising an epitaxial material;
    forming source and drains on opposite sides of the at least one fin stack;
    burying the at least one dummy gate in a dielectric material;
    selectively removing the at least one dummy gate forming at least one gate trench in the dielectric material;
    selectively removing, through the at least one gate trench, either the first nanosheets or the second nanosheets from the at least one fin stack; and
    forming at least one replacement gate in the at least one gate trench.

2. The method of claim 1, wherein the first material comprises epitaxial silicon germanium (SiGe) and the second material comprises epitaxial silicon (Si).

3. The method of claim 2, wherein the strain-inducing material comprises epitaxial SiGe.

4. The method of claim 3, wherein a germanium (Ge) content of the strain-inducing material is greater than a Ge content of the first material.

5. The method of claim 4, wherein the Ge content of the strain-inducing material is from about 60% Ge to about 100% Ge, and ranges therebetween.

6. The method of claim 4, wherein the Ge content of the first material is from about 30% Ge to about 60% Ge, and ranges therebetween.

7. The method of claim 1, wherein the at least one dummy gate comprises a material selected from the group consisting of: poly-Si, amorphous Si, and combinations thereof.

8. The method of claim 1, further comprising the step of:
    covering the source and drains with an etch stop layer prior to burying the at least one dummy gate in the dielectric material.

9. The method of claim 8, wherein the etch stop layer comprises a material selected from the group consisting of: silicon nitride (SiN), silicon boron carbon nitride (SiBCN), silicon oxycarbon nitride (SiOCN), silicon carbon nitride (SiCN), and combinations thereof.

10. The method of claim 1, wherein the first nanosheets are selectively removed from the at least one fin stack, and wherein the replacement gate formed in the gate trench surrounds the second nanosheets in a gate-all-around configuration.

11. The method of claim 1, wherein the second nanosheets are selectively removed from the at least one fin stack, and wherein the replacement gate formed in the gate trench surrounds the first nanosheets in a gate-all-around configuration.

12. The method of claim 1, wherein the stack is patterned into at least one first fin stack and at least one second fin stack, wherein the second nanosheets are removed from the at least one first fin stack selective to the first nanosheets, and wherein the first nanosheets are removed from the at least one second gate stack selective to the second nanosheets.

13. The method of claim 1, further comprising the steps of:
    forming at least one first dummy gate and at least one second dummy gate on the stack;
    patterning the stack into at least one first fin stack beneath the at least one first dummy gate and into at least one second fin stack beneath the at least one second dummy gate; and burying the at least one first dummy gate and the at least one second dummy gate in the dielectric material.

14. The method of claim 13, further comprising the steps of:

masking the at least one second dummy gate;

selectively removing the at least one first dummy gate forming at least one first gate trench in the dielectric material;

selectively removing, through the at least one first gate trench, the second nanosheets from the at least one first fin stack;

forming at least one first replacement gate in the at least one first gate trench;

masking the at least one first replacement gate;

selectively removing the at least one second dummy gate forming at least one second gate trench in the dielectric material;

selectively removing, through the at least one second gate trench, the first nanosheets from the at least one second fin stack; and forming at least one second replacement gate in the at least one second gate trench.

15. The method of claim 13, further comprising the steps of:

selectively removing the at least one first dummy gate and the at least one second dummy gate forming at least one first gate trench and at least one second gate trench in the dielectric material;

masking the at least one second gate trench;

selectively removing, through the at least one first gate trench, the second nanosheets from the at least one first fin stack;

forming at least one first replacement gate in the at least one first gate trench;

masking the least one first replacement gate;

selectively removing, through the at least one second gate trench, the first nanosheets from the at least one second fin stack; and forming at least one second replacement gate in the at least one second gate trench.

* * * * *